(12) United States Patent
Nurmi

(10) Patent No.: US 9,461,006 B2
(45) Date of Patent: Oct. 4, 2016

(54) INTEGRATED CIRCUIT PROTECTION LAYER USED IN A CAPACITIVE CAPACITY

(75) Inventor: Juha H-P Nurmi, Salo (FI)

(73) Assignee: Core Wireless Licensing S.a.r.l., Luxembourg (LU)

( * ) Notice: Subject to any disclaimer, the term of this patent is extended or adjusted under 35 U.S.C. 154(b) by 2354 days.

(21) Appl. No.: 12/321,581

(22) Filed: Jan. 21, 2009

(65) Prior Publication Data

US 2010/0182286 A1    Jul. 22, 2010

(51) Int. Cl.
*H01L 23/64* (2006.01)
*G09G 3/36* (2006.01)
*H01L 23/00* (2006.01)

(52) U.S. Cl.
CPC ............. *H01L 23/642* (2013.01); *H01L 24/14* (2013.01); *G09G 3/3611* (2013.01); *G09G 2370/16* (2013.01); *H01L 2924/12041* (2013.01); *H01L 2924/14* (2013.01); *H01L 2924/1461* (2013.01); *H01L 2924/15788* (2013.01)

(58) Field of Classification Search
CPC ............................ G09G 3/3611; H01L 23/642
USPC ........................................................ 345/204
See application file for complete search history.

(56) References Cited

U.S. PATENT DOCUMENTS

| 6,368,514 B1 * | 4/2002 | Metzler ............................. 216/6 |
| 2004/0201787 A1 * | 10/2004 | Sekiguchi et al. .............. 349/16 |
| 2005/0206603 A1 * | 9/2005 | Kawachi et al. ............... 345/98 |

OTHER PUBLICATIONS

"62.1: FPC-free Panel with Capacitive Coupling for Transmission of Signal and Power", Futoshi Furuta et al., Hitachi SID 2008, 4 pgs.

* cited by examiner

*Primary Examiner* — William Boddie
*Assistant Examiner* — Andrew Schnirel
(74) *Attorney, Agent, or Firm* — Core Wireless Licensing Ltd.

(57) ABSTRACT

In one exemplary embodiment of the invention, an apparatus includes: at least one functional circuit; and an electrically-conductive protective layer on a protected surface of the apparatus, where the protective layer is arranged to be substantially opaque to incident light, where at least one portion of the protective layer is electrically isolated from a remainder of the protective layer, where the at least one portion is a plate of a capacitor for coupling at least one signal to said at least one functional circuit.

14 Claims, 13 Drawing Sheets

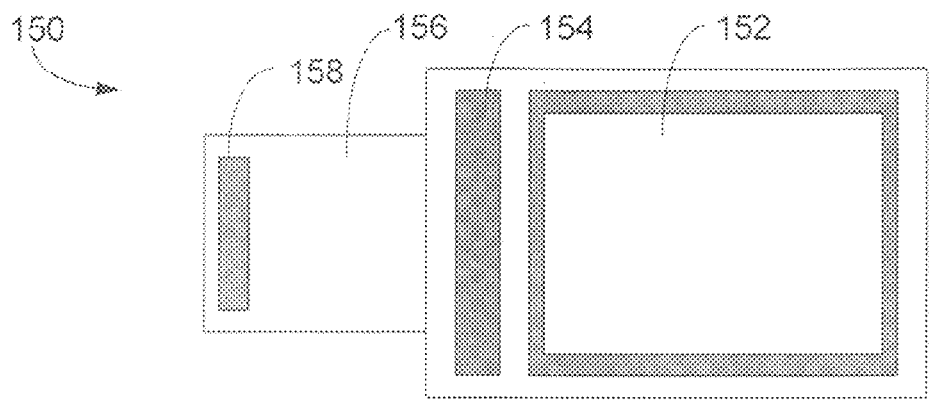
FIG. 1 – PRIOR ART
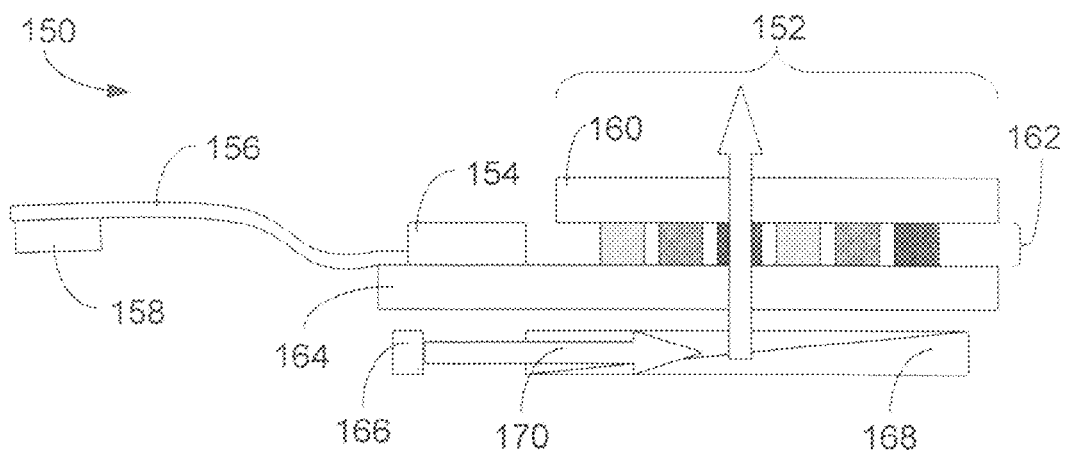
FIG. 2 – PRIOR ART

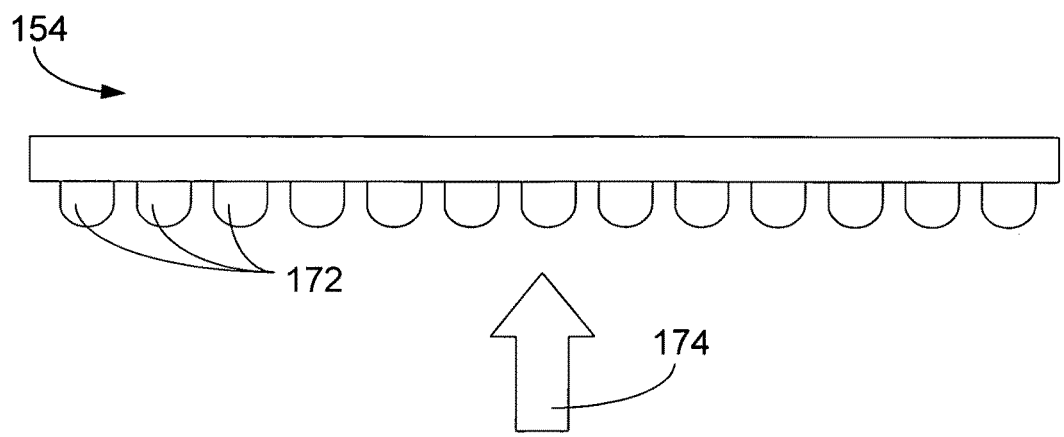
FIG. 3 – PRIOR ART
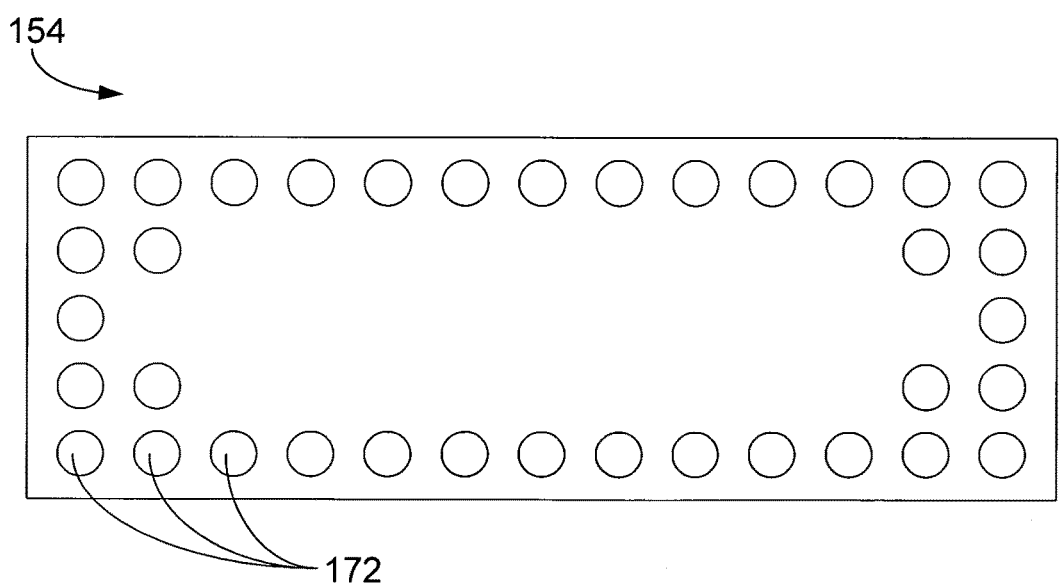
FIG. 4 – PRIOR ART

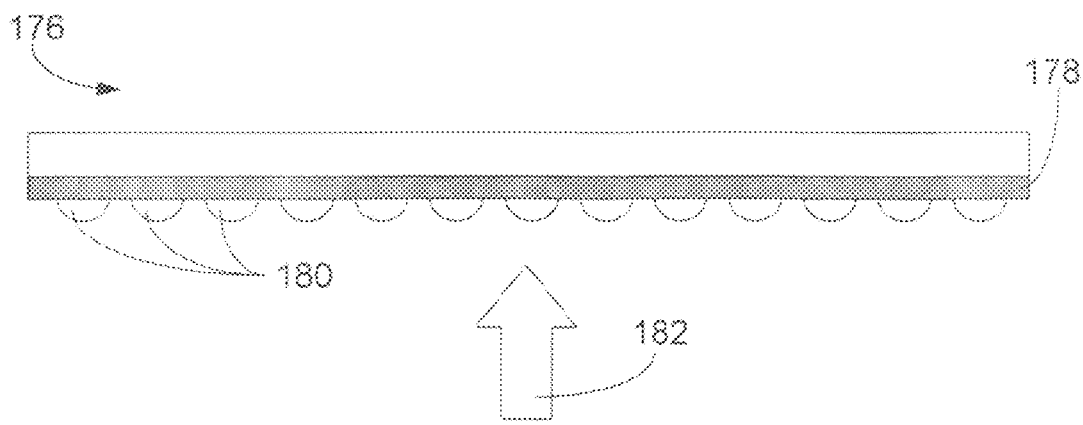
FIG. 5 – PRIOR ART
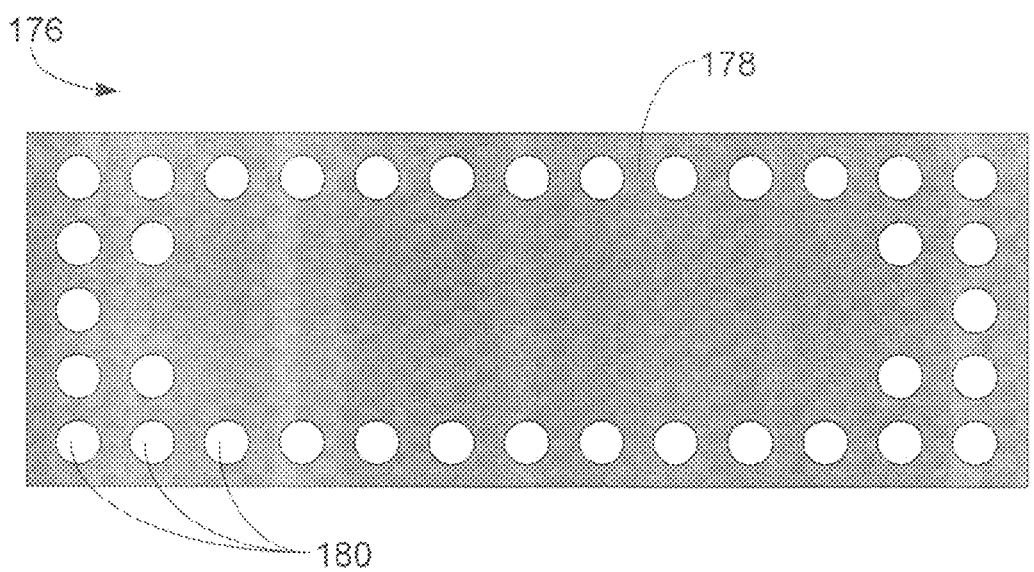
FIG. 6 – PRIOR ART

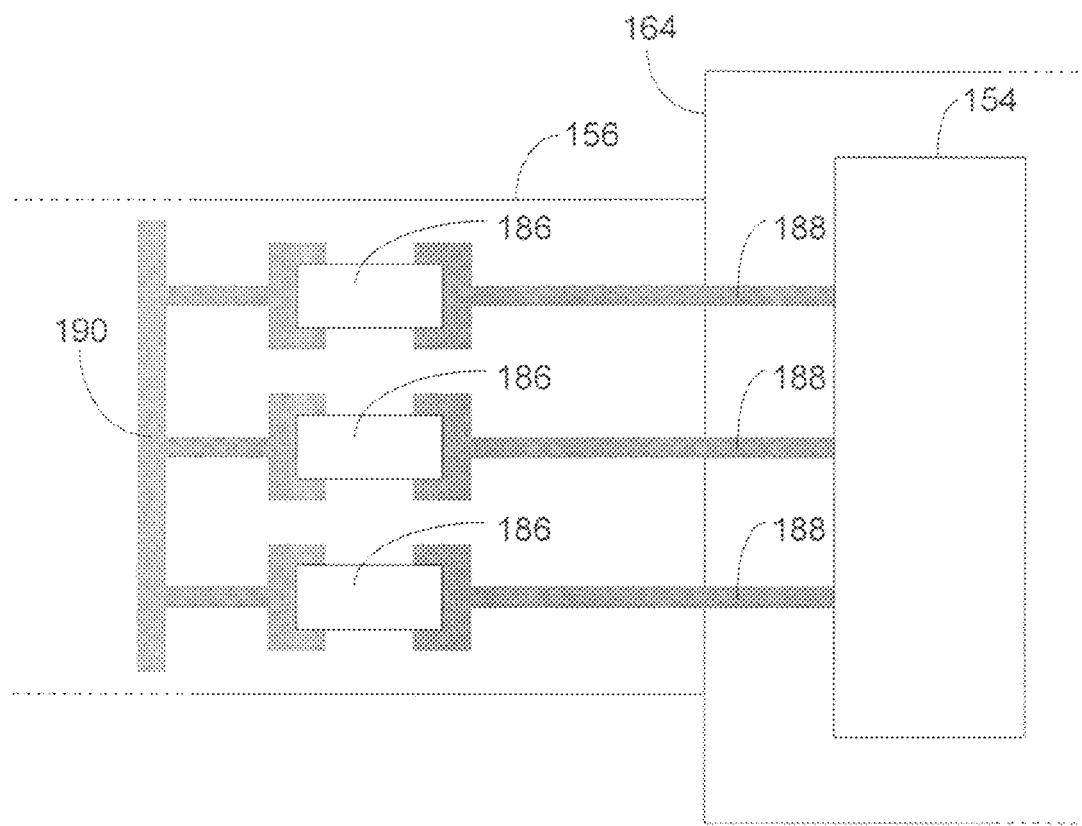
FIG. 7 – PRIOR ART

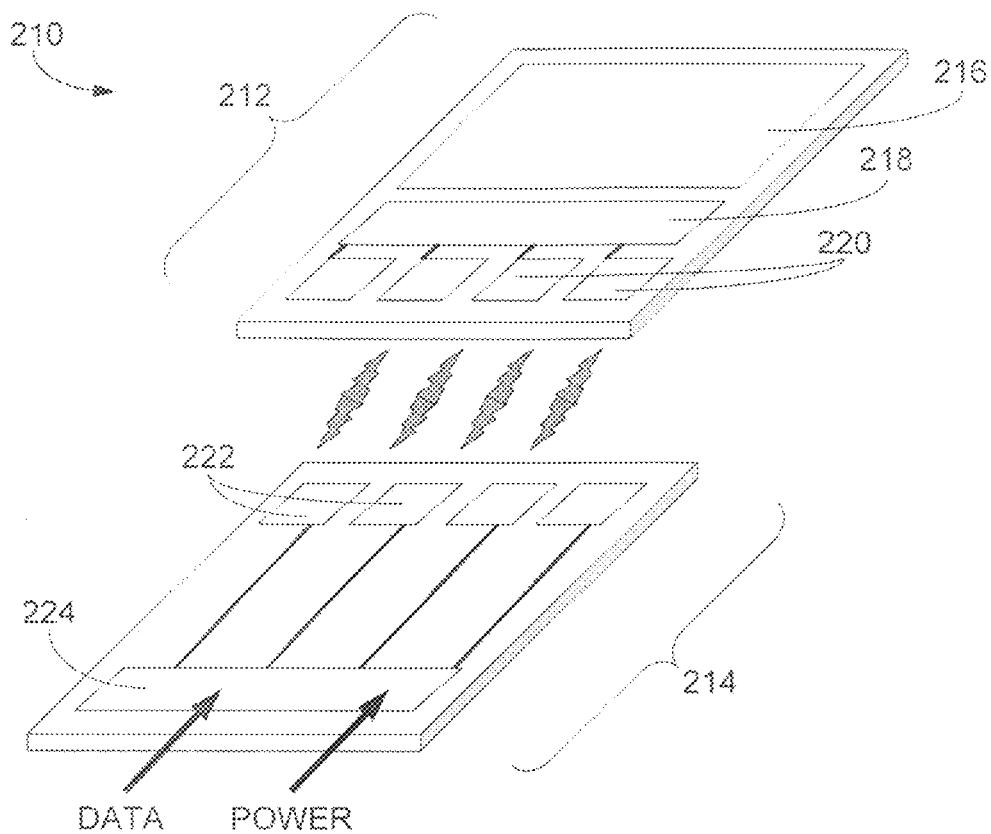
FIG. 8 – PRIOR ART
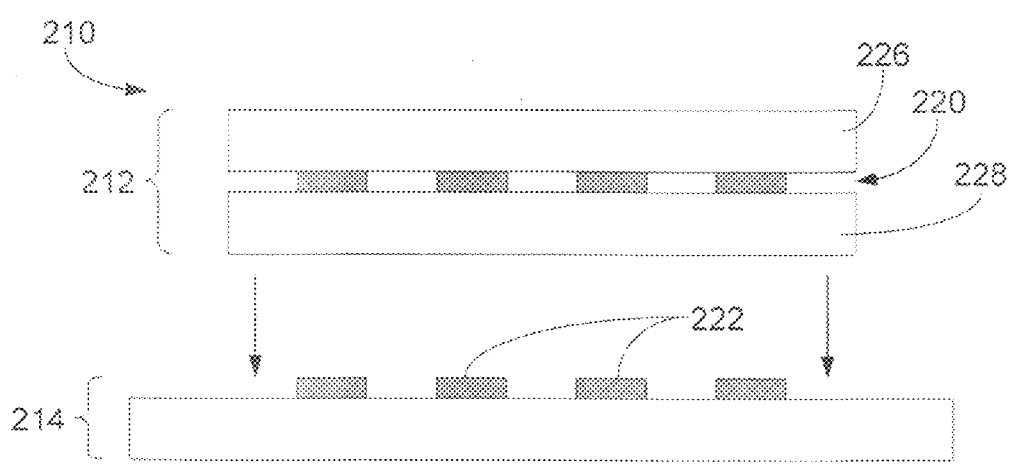
FIG. 9 – PRIOR ART

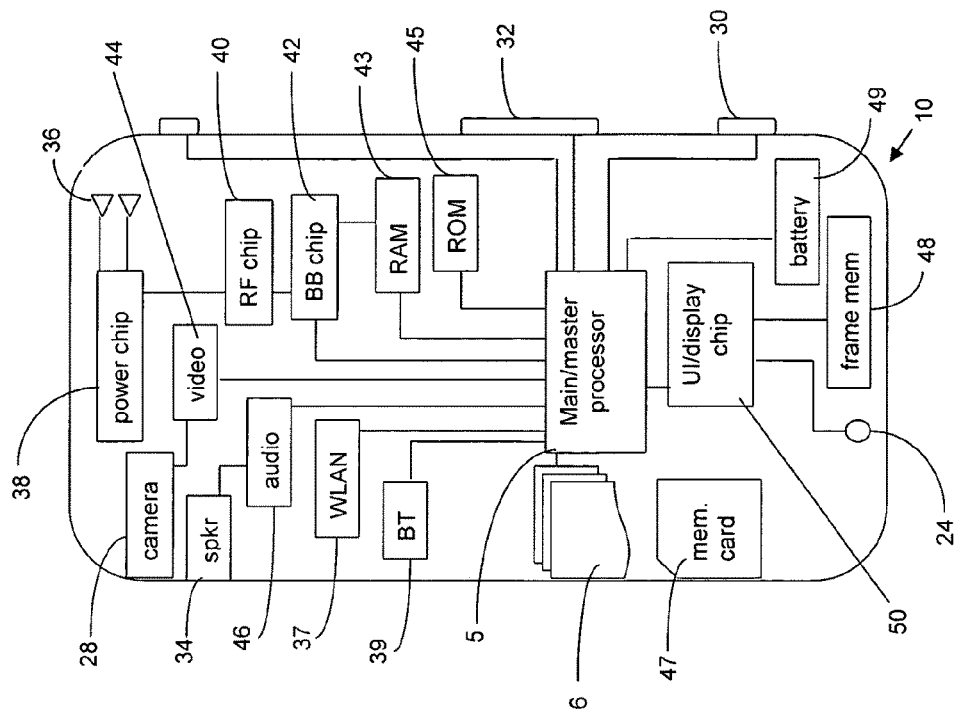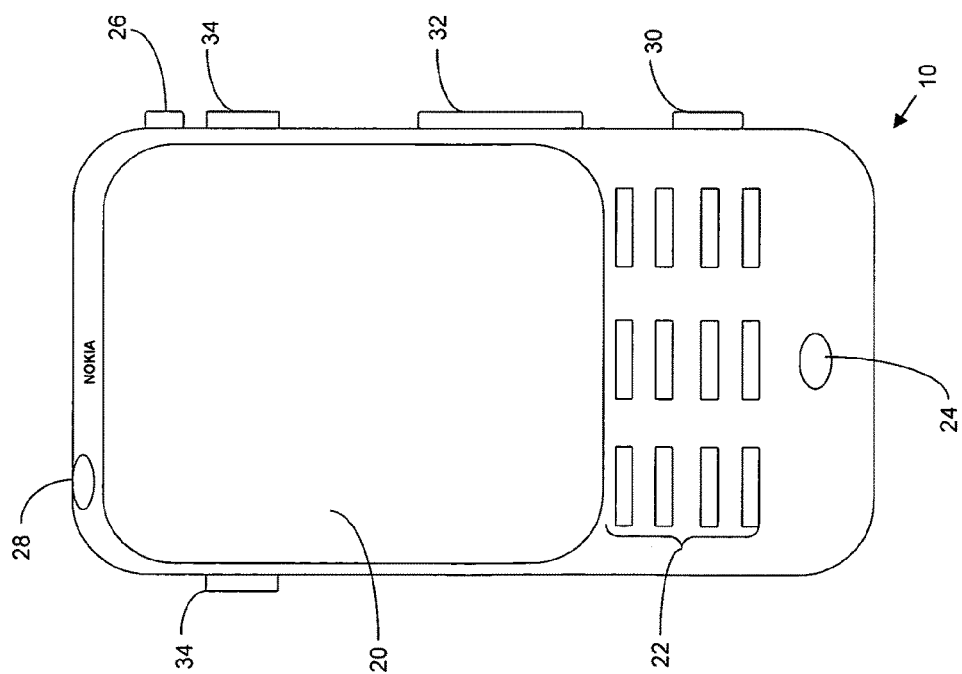
FIG. 12

INTEGRATED CIRCUIT PROTECTION LAYER USED IN A CAPACITIVE CAPACITY

TECHNICAL FIELD

The exemplary and non-limiting embodiments of this invention relate generally to portable devices, apparatus and methods and, more specifically, relate to techniques for minimizing components used with an integrated circuit.

BACKGROUND

The following abbreviations are utilized herein:
AC alternating current
DC direct current
ITO indium tin oxide
LCD liquid crystal display
LED light emitting diode
RC resistor-capacitor Electronic devices generally include a display for presenting information to the user. FIG. 1 shows a top view of an exemplary display module 150 for an electronic device. The display module 150 includes a display panel 152 that is controlled by a display driver/controller 154. A flexible printed cable 156 and a connector 158 enable connection of the display driver 154 to other components of the electronic device, such as a power source (e.g., battery) and/or another controller (e.g., one or more processors). As a non-limiting example, the display driver 154 may comprise an integrated circuit suitable for controlling the display of information (e.g., data, images) on the display panel 152. As a non-limiting example, the display panel 152 may comprise a LCD. As a non-limiting example, the electronic device may comprise a mobile device, such as a portable computer or a mobile phone, for example.

A LCD is an electronically-modulated optical device shaped into a thin, flat panel and comprised of a number of pixels filled with liquid crystals and arrayed in front of a light source (backlight) or reflector. LCDs are often employed in battery-powered electronic devices because they use comparatively small amounts of power. As a non-limiting example, the light source may comprise one or more LEDs.

FIG. 2 shows a side view of the exemplary display module 150 of FIG. 1. The display panel 152 is comprised of a number of components. An upper glass 160 may be disposed above a layer of liquid crystal material 162 comprised of color filters. The layer of liquid crystal material 162 may be disposed on a bottom glass 164. The display driver 154 may be situated on (e.g., connected to or connected via) the bottom glass 164, as may one end of the flexible printed cable 156. Underneath the bottom glass 164 may be a light source, such as a LED 166. A light guide 168 may enable the transfer of the light 170 from the LED 166 to illuminate the display panel 152. In other display modules, a prism sheet or other component may be utilized to improve the illumination uniformity of the display panel 152.

FIG. 3 shows a side view of the exemplary display driver 154 of FIG. 1. The display driver/controller 154 includes a plurality of connectors which may comprise, as a non-limiting example, a plurality of bumps 172. The connectors (bumps 172) allow the display driver 154 to communicate with and/or control other components of the mobile device, including the display panel 152. Light 174, such as light from the LED 166, is incident upon the bottom (underside) of the display driver 154. FIG. 4 shows a bottom view of the exemplary display driver 154 of FIG. 3.

The light 174 (e.g., energy from the light) can interfere with operations of the display driver 154, for example, by changing or affecting register values. As such, it is desirable to protect at least the bottom of the display driver 154 from incident light. One technique for providing this protection is to use an additional metal layer on the surface of the display driver 154.

FIG. 5 shows a side view of an exemplary display driver 176 that includes a protective layer 178. The connectors, such as bumps 180, may protrude beyond the protective layer 178 to provide connection(s) with one or more other components of the display module and/or mobile device. As a non-limiting example, the protective layer 178 may be comprised of a metal, and serves to protect the bottom of the display driver 176 from incident light 182. FIG. 6 shows a bottom view of the exemplary display driver 176 of FIG. 5. The protective layer 178 preferably does not otherwise interfere with operations of the display driver 176.

Generally, one cannot integrate all of the capacitors needed on the display driver 154. Therefore, external capacitors, disposed on the flexible printed cable, are often utilized. FIG. 7 depicts the use of external capacitors 186 on the flexible printed cable 156 of FIG. 1. The external capacitors 186 may be coupled to the display driver 154 (mounted on the bottom glass 164) via ITO traces 188. On the other side, the external capacitors 186 may be coupled to the other components via the foil trace 190. It should be noted that the trace is a conductive material (e.g., copper).

A capacitor is an electrical component comprised of two conductors separated by a nonconductive region. The nonconductive region may be referred to as a dielectric medium or dielectric layer, though the region may be comprised of air, a vacuum, a dielectric or a semiconductor depletion region chemically identical to the conductors, as non-limiting examples. When a voltage potential difference occurs between the two conductors, an electric field occurs in the insulator (the nonconductive region). This electric field can be used to store energy, to resonate with a signal, or to link electrical forces, as non-limiting examples. While capacitors are generally manufactured as electronic components for use in electrical circuits, any two conductors linked by an electric field display this property. Generally, the effect is greatest between wide, flat, parallel, narrowly-separated conductors. Capacitors pass AC signals but block DC signals.

An ideal capacitor is often characterized by a constant value, capacitance, given as a ratio of the amount of charge in each conductor to the potential difference between them. The unit of capacitance is thus coulombs per volt, or farads. Higher capacitance indicates that more charge may be stored at a given energy level, or voltage. In actual capacitors, the insulator allows a small amount of current through, called leakage current, the conductors add an additional series resistance, and the insulator has an electric field strength limit resulting in a breakdown voltage.

Capacitive coupling refers to the use of a capacitor to transfer energy. That is, capacitive coupling enables the transfer of energy (e.g., within an electrical system or network) by means of the capacitance between the two conductors. Capacitive coupling favors transfer of the higher frequency components of a signal, whereas inductive coupling (the transfer of energy using inductance) favors lower frequency components, and conductive coupling (the transfer of energy using conductors) favors neither higher nor lower frequency components. In this context, capacitive coupling may also be considered contactless signal transmission via the electrostatic effect induced between the two conductors (the capacitance across the two conductors).

In FIGS. 1 and 2, the exemplary display module 150 may be coupled to other components via the flexible printed cable 156 and the connector 158. This electrical coupling may be achieved by a direct connection (i.e., a contact connection) using the connector 158. There are other, contactless techniques for coupling a display module.

FIG. 8 shows a perspective view of an exemplary contactless display module 210. The display module 210 is comprised of two components: a receiving panel 212 and a transmitting board 214. The receiving panel 212 includes a LCD display 216, receiver circuitry 218 and a number of receiver electrodes 220. The transmitting board 214 includes a number of transmitter electrodes 222 and transmitter circuitry 224. The transmitter circuitry 224 may receive display data signals and a power signal from other components (not shown). The receiver electrodes 220 and the transmitter electrodes 222 are capacitively coupled to enable the transmission of signals (e.g., the display data signals) from the transmitting board 214 to the receiving panel 212. Note that the receiver electrodes 220 and the transmitter electrodes 224 are not in direct contact with one another (i.e., they do not physically touch). A capacitive connection (between the two sets of electrodes) is used instead of a conductive connection (e.g., a direct connection using contacts or connectors).

FIG. 9 shows a side view of the exemplary contactless display module 210 of FIG. 8. The receiving panel 212 may include two layers of glass substrate 226, 228 between which the receiver electrodes 220 are sandwiched. The receiving panel 212 may be disposed above the transmitting board 214 such that the receiver electrodes 220 and the transmitter electrodes 222 are separated by the nonconductive material of the glass substrate 228.

SUMMARY

The below summary section is intended to be merely exemplary and non-limiting.

In one exemplary embodiment of the invention, an apparatus comprising: at least one functional circuit; and an electrically-conductive protective layer on a protected surface of the apparatus, where the protective layer is arranged to be substantially opaque to incident light, where at least one portion of the protective layer is electrically isolated from a remainder of the protective layer, where the at least one portion comprises a plate of a capacitor for coupling at least one signal to said at least one functional circuit.

In another exemplary embodiment of the invention, a method comprising: applying an electrical signal to a first electrically-conductive pad; and capacitively coupling the electrical signal from the first pad to a functional circuit of an integrated circuit module through an opposing second pad, where the second pad is arranged as a portion of an electrically-conductive protective layer on a protected surface of the integrated circuit module, where the second pad is electrically isolated from a remainder of the protective layer.

BRIEF DESCRIPTION OF THE DRAWINGS

The foregoing and other aspects of exemplary embodiments of this invention are made more evident in the following Detailed Description, when read in conjunction with the attached Drawing Figures, wherein:

FIG. 1 shows a top view of an exemplary display module for an electronic device;

FIG. 2 shows a side view of the exemplary display module of FIG. 1;

FIG. 3 shows a side view of the exemplary display driver of FIG. 1;

FIG. 4 shows a bottom view of the exemplary display driver of FIG. 3;

FIG. 5 shows a side view of an exemplary display driver that includes a protective layer;

FIG. 6 shows a bottom view of the exemplary display driver of FIG. 5;

FIG. 7 depicts the use of external capacitors on the flexible printed cable of FIG. 1;

FIG. 8 shows a perspective view of an exemplary contactless display module;

FIG. 9 shows a side view of the exemplary contactless display module of FIG. 8;

FIG. 12 shows a more particularized block diagram of an exemplary user equipment such as that shown in FIG. 11;

DETAILED DESCRIPTION

Generally, it is desirable to provide techniques that enable a reduction in size of electronic components, modules and devices. For example, the external capacitors (see FIG. 7) and/or the pads for capacitive coupling (see FIGS. 8 and 9) increase the size of the display module. Thus, it is further desirable to provide techniques that enable a reduction in the size of the display module, particularly in reference to display modules suitable for use in mobile devices (e.g., mobile phones).

The exemplary embodiments of the invention enable such a reduction in size by using one or more portions (e.g., separate areas or regions) of the protective layer as a plate for a capacitor. In some exemplary embodiments, such a plate is utilized in conjunction with an opposing pad for the transmission of one or more signals via capacitive coupling. In other exemplary embodiments, portions of two or more stacked protective layers are used to form one or more capacitors. In further exemplary embodiments, the two or more stacked layers create a seamless protective layer (e.g., against light emitted by a LED) by usage of a staggered arrangement (i.e., by staggering gaps in the individual layers so as to maximize the protective coverage).

Figure 10:
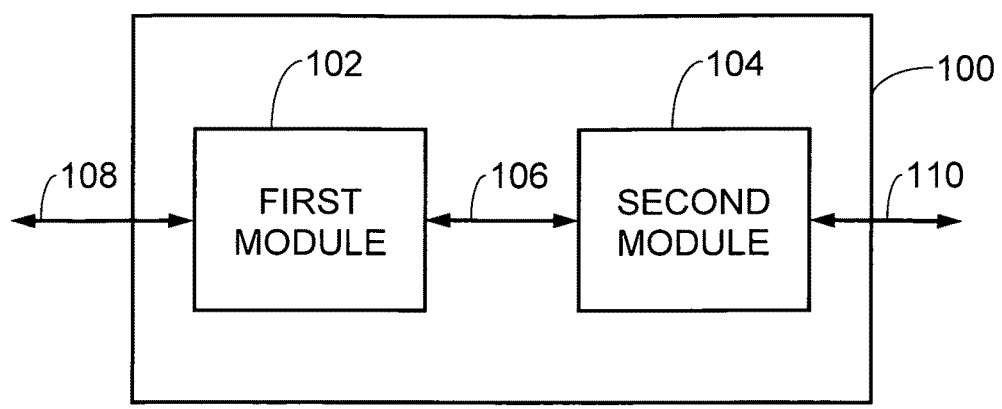
FIG. 10 shows a simplified block diagram of various exemplary electronic devices that are suitable for use in practicing the exemplary embodiments of this invention.

Reference is made to FIG. 10 for depicting a simplified block diagram of various exemplary electronic devices 100 that are suitable for use in practicing the exemplary embodiments of this invention. The electronic device 100 includes at least a first module 102 connected, via a connection 106, to a second module 104. The first module 102 incorporates aspects of the exemplary embodiments of the invention as described in further detail herein.

In some exemplary embodiments, the first module 102 is capacitively coupled, via the connection 106, to the second module 104. That is, the connection 106 may be a capacitive connection. In other exemplary embodiments, the first module 102 is capacitive coupled, via a connection 108, to one or more modules, devices or systems that are external to the electronic device 100. In some exemplary embodiments, the second module 104, or another module of the electronic device 100, may be connected (e.g., via a connection 110) to one or more modules, devices or systems that are external to the electronic device 100. It should be noted that the capacitive coupling enables the transfer of information and, furthermore, that at least one plate used for the capacitive coupling is disposed in a protection layer of the first module 102.

In some exemplary embodiments, the first module 102 may comprise at least one circuit, a circuit module, at least one integrated circuit or an integrated circuit module, as non-limiting examples. In other exemplary embodiments, the first module 102 may comprise a display module having at least one circuit, a circuit module, at least one integrated circuit or an integrated circuit module, as non-limiting examples. In further exemplary embodiments, the first module 102 may comprise at least one circuit, a circuit module, at least one integrated circuit or an integrated circuit module, as non-limiting examples, and the other module 104 may comprise a display module. In such exemplary embodiments, the display module may be further connected to one or more additional modules, components or circuits of the electronic device 100. In some of those exemplary embodiments, the further connection may comprise a capacitive connection enabled by the first module 102.

Figure 11:
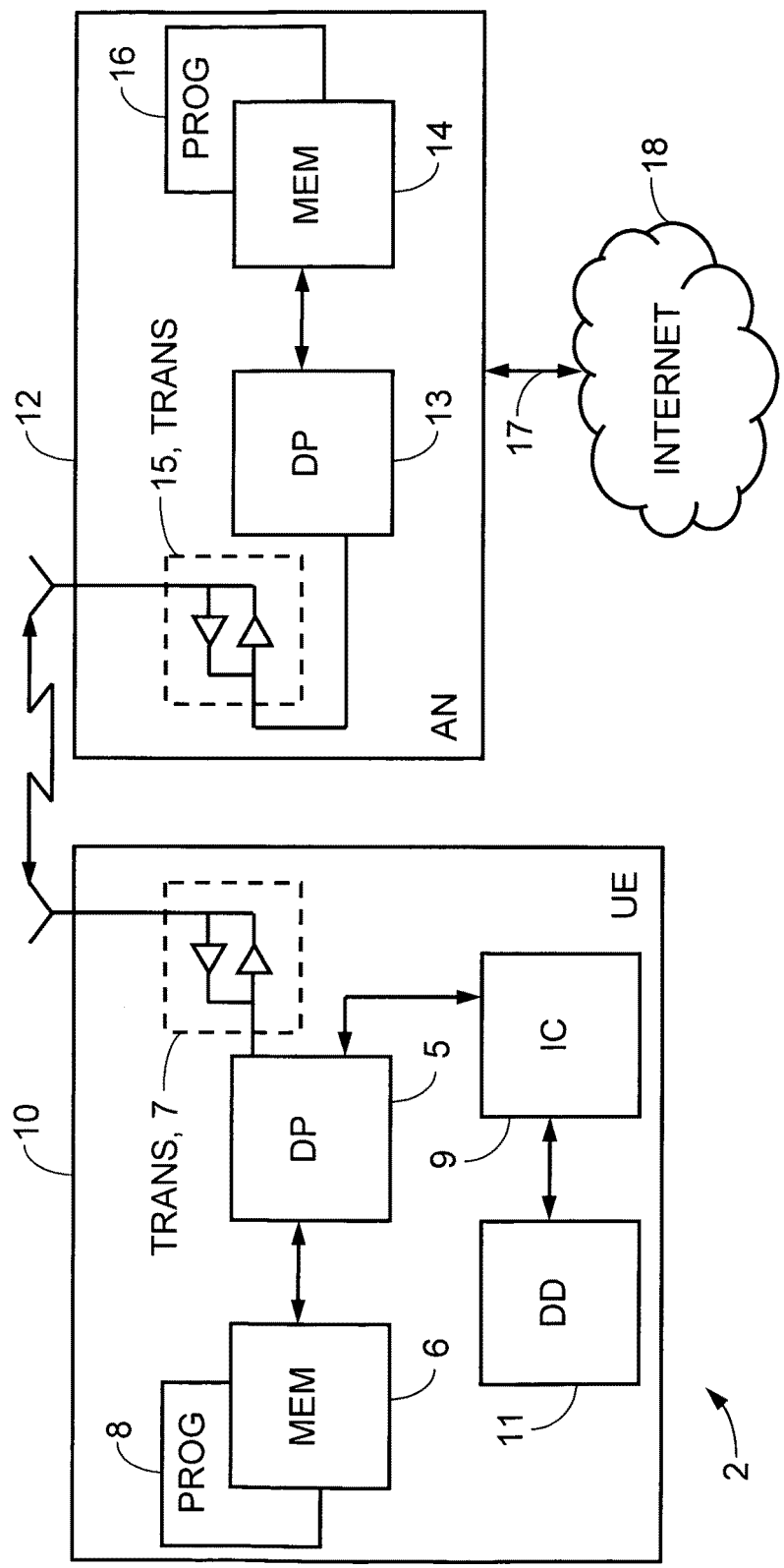
FIG. 11 shows a simplified block diagram of further exemplary electronic devices that are suitable for use in practicing the exemplary embodiments of this invention.

Reference is made to FIG. 11 for illustrating a simplified block diagram of further electronic devices that are suitable for use in practicing the exemplary embodiments of this invention. In FIG. 11, a wireless network 2 is adapted for communication with a user equipment (UE) 10 via an access node (AN) 12. The UE 10 includes a data processor (DP) 5, a memory (MEM) 6 coupled to the DP 5, and a suitable RF transceiver (TRANS) 7 (having a transmitter (TX) and a receiver (RX)) coupled to the DP 5. The MEM 6 stores a program (PROG) 8. The TRANS 7 is for bidirectional wireless communications with the AN 12. Note that the TRANS 7 has at least one antenna to facilitate communication. The UE 10 also includes at least one integrated circuit (IC) 9, in accordance with the exemplary embodiments of the invention. The IC 9 may be coupled to a display device (DD) 11. As a non-limiting example, the DD 11 may comprise a LCD.

The AN 12 includes a data processor (DP) 13, a memory (MEM) 14 coupled to the DP 13, and a suitable RF transceiver (TRANS) 15 (having a transmitter (TX) and a receiver (RX)) coupled to the DP 13. The MEM 14 stores a program (PROG) 16. The TRANS 15 is for wireless communication with the UE 10. Note that the TRANS 15 has at least one antenna to facilitate communication. The AN 12 is coupled via a data path 17 to one or more external networks or systems, such as the internet 18, for example.

At least one of the PROGs 8, 16 is assumed to include program instructions that, when executed by the associated DP 5, 13, enable the respective electronic device to operate in accordance with the exemplary embodiments of this invention, as discussed herein.

In general, the various exemplary embodiments of the UE 10 can include, but are not limited to, mobile nodes, mobile stations, mobile phones, cellular phones, personal digital assistants (PDAs) having wireless communication capabilities, mobile routers, relay stations, relay nodes, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

In general, the various exemplary embodiments of the AN 12 can include, but are not limited to, wireless access nodes, base stations, relay nodes, relay stations, routers and mobile routers.

The exemplary embodiments of this invention may be implemented by computer software executable by one or more of the DPs 5, 13 of the UE 10 and the AN 12, or by hardware, or by a combination of software and hardware. In some exemplary embodiments, the DP 5 may comprise the IC 9. In other exemplary embodiments, the DD 11 may comprise a display module incorporating the IC 9. In further exemplary embodiments, instead of or in addition to the UE 12, the AN 12 may comprise the IC and/or the DD.

The MEMs 6, 14 may be of any type suitable to the local technical environment and may be implemented using any suitable data storage technology, such as semiconductor-based memory devices, flash memory, magnetic memory devices and systems, optical memory devices and systems, fixed memory and removable memory, as non-limiting examples. The DPs 5, 13 may be of any type suitable to the local technical environment, and may include one or more of general purpose computers, special purpose computers, microprocessors, digital signal processors (DSPs) and processors based on a multi-core processor architecture, as non-limiting examples.

FIG. 12 illustrates further detail of an exemplary UE 10 in both plan view (left) and sectional view (right). Exemplary embodiments of the invention may be embodied in one or more combinations that include one or more function-specific components, such as those shown in FIG. 12. As shown in FIG. 12, the UE 10 includes a graphical display interface 20, a user interface 22 comprising a keypad, a microphone 24 and speaker(s) 34. In further exemplary embodiments, the UE 10 may also encompass touch-screen technology at the graphical display interface 20 and/or voice-recognition technology for audio signals received at the microphone 24. A power actuator 26 controls the UE 10 being turned on and/or off by the user. The UE 10 may include a camera 28, which is shown as forward facing (e.g., for video calls) but may alternatively or additionally be rearward facing (e.g., for capturing images and video for local storage). The camera 28 may be controlled by a shutter actuator 30 and optionally by a zoom actuator 32, which may alternatively function as a volume adjustment for the speaker(s) 34 when the camera 28 is not in an active mode.

Within the sectional view of FIG. 12 are seen multiple transmit/receive antennas 36 that are typically used for wireless communication (e.g., cellular communication). The antennas 36 may be multi-band for use with other radios in the UE. The operable ground plane for the antennas 36 is shown by shading as spanning the entire space enclosed by the UE housing, though in some embodiments the ground plane may be limited to a smaller area, such as disposed on a printed wiring board on which a power chip 38 is formed. The power chip 38 controls power amplification on the channels being transmitted on and/or across the antennas that transmit simultaneously, where spatial diversity is used, and amplifies received signals. The power chip 38 outputs the amplified received signal to the radio frequency (RF) chip 40, which demodulates and downconverts the signal for baseband processing. The baseband (BB) chip 42 detects the signal, which is then converted to a bit-stream and finally decoded. Similar processing occurs in reverse for signals generated in the UE 10 and transmitted from it.

Signals to and from the camera 28 pass through an image/video processor (video) 44, which encodes and decodes the image data (e.g., image frames). A separate audio processor 46 may also be present to control signals to and from the speakers (spkr) 34 and the microphone 24. The graphical display interface 20 is refreshed from a frame memory (frame mem) 48 as controlled by a user interface/display chip 50, which may process signals to and from the display interface 20 and/or additionally process user inputs from the keypad 22 and elsewhere.

Certain exemplary embodiments of the UE 10 may also include one or more secondary radios such as a wireless local area network radio (WLAN) 37 and/or a Bluetooth® radio (BT) 39, which may incorporate one or more on-chip antennas or be coupled to one or more off-chip antennas. Throughout the UE 10 are various memories, such as a random access memory (RAM) 43, a read only memory (ROM) 45, and, in some exemplary embodiments, a removable memory such as the illustrated memory card 47. In some exemplary embodiments, the various programs 8 are stored on the memory card 47. The components within the UE 10 may be powered by a portable power supply such as a battery 49.

The aforesaid processors 38, 40, 42, 44, 46, 50, if embodied as separate entities in the UE 10 or the eNB 12, may operate in a master-slave relationship with respect to the main/master processor 5, 13. Exemplary embodiments of this invention may be most relevant to the user interface/display chip 50, though it is noted that other exemplary embodiments need not be disposed in such devices or components, but may be disposed across various chips and/or memories as shown, or disposed within one or more other processors that combine one or more of the functions described above with respect to FIG. 12. Any or all of these various processors of FIG. 12 may access one or more of the various memories, which may be on-chip with the processor or separate therefrom. Similar function-specific components that are directed toward communications over a network broader than a piconet (e.g., components 36, 38, 40, 42-45 and 47) may also be disposed in exemplary embodiments of the access node 12, which, in some exemplary embodiments, may include an array of tower-mounted antennas rather than the antennas 36 shown in FIG. 12.

Note that the various processors and/or chips (e.g., 38, 40, 42, etc.) described above may be combined into a fewer number of such processors and/or chips and, in a most compact case, may be embodied physically within a single processor or chip.

While described above in reference to memories, these components may generally be seen to correspond to storage devices, storage circuits, storage components and/or storage blocks. In some exemplary embodiments, these components may comprise one or more computer-readable mediums, one or more computer-readable memories and/or one or more program storage devices.

While described above in reference to data processors, these components may generally be seen to correspond to processors, data processors, processing devices, processing components, processing blocks, circuits, circuit devices, circuit components, circuit blocks, integrated circuits and/or chips (e.g., chips comprising one or more circuits or integrated circuits).

Figure 13:
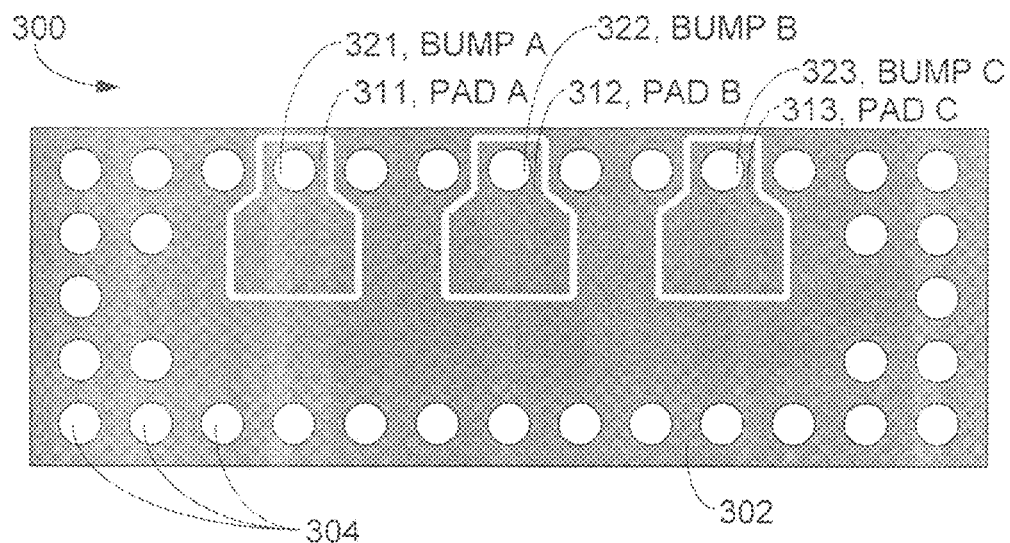
FIG. 13 shows a bottom view of a first exemplary embodiment of the invention wherein an exemplary integrated circuit module utilizes three portions of an electrically-conductive protective layer as plates or pads of one or more capacitors.

FIG. 13 shows a bottom view of a first exemplary embodiment of the invention wherein an exemplary integrated circuit module 300 utilizes three portions 311, 312, 313 of an electrically-conductive protective layer 302 as plates or pads of one or more capacitors. The three pads, pad A 311, pad B 312 and pad C 313, are electrically isolated from each other and from the remainder of the protective layer 302. Each of the three pads, pad A 311, pad B 312 and pad C 313, is coupled to a different connector, bump A 321, bump B 322 and bump C 323, respectively. The remaining bumps 304 are coupled to one or more other components (external or internal) of the integrated circuit module 300. The integrated circuit module 300 also has at least one functional circuit coupled to at least one of the three pads. As a non-limiting example, the at least one functional circuit may be coupled to one or more bumps that are coupled to the respective one or more pads.

Figure 14:
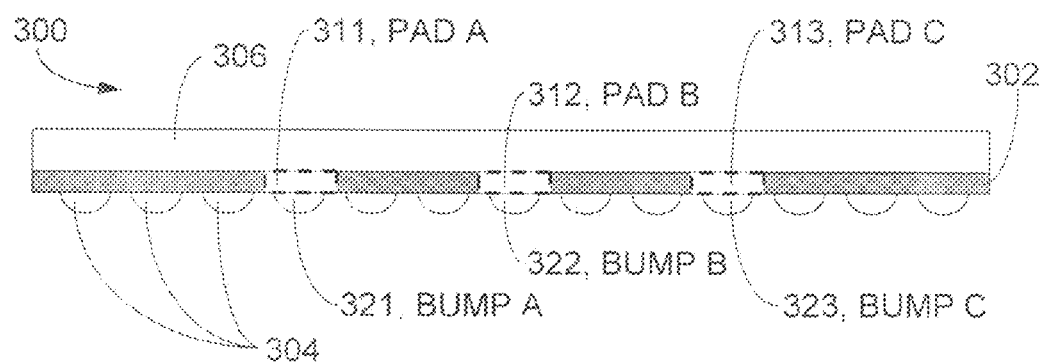
FIG. 14 shows a side view of the exemplary integrated circuit module of FIG. 13.

FIG. 14 shows a side view of the exemplary integrated circuit module 300 of FIG. 13. As can be seen in FIG. 14, the integrated circuit module 300 comprises additional layers, circuits, functional circuits, components and/or materials (conductive and/or nonconductive), collectively referred to as an interior region 306. One of ordinary skill in the art will appreciate the various components, materials and arrangements available for the interior region 306 of the integrated circuit module 300.

As non-limiting examples, the capacitor formed with the at least one pad (pad A 311, pad B 312 and/or pad C 313) may be utilized for one or more of the following purposes: filtering power lines (e.g., between +1.2V and ground) that are powering the integrated circuit module, as a component in a RC-circuit (e.g., for an internal clock circuit), and extending another, internal capacitor of the integrated circuit module 300. As a non-limiting example, the electrically-conductive protective layer 302 is comprised of a metal or a material that includes a metal. As a further non-limiting example, the electrically-conductive protective layer 302 may be comprised of Aluminum.

It should be noted that the capacitance of the capacitor formed with the at least one pad (pad A 311, pad B 312 and/or pad C 313) generally is a function of the (total) pad area, the separation distance between the pads of the capacitor and/or the permittivity (e.g., isolation material permeability) of the dielectric medium (e.g., air, insulator) between the pads of the capacitor. As non-limiting examples: the area of the pads can range from 9-49 mm$^2$; the separation distance can range from 0.5-1.0 mm (a smaller separation distance generally leads to an increase in capacitance); and the capacitance can range from 80-860 fF. These values are merely exemplary, and other values and ranges of values are possible. As a further non-limiting example, a maximum size of the pad (e.g., using only one pad) may be the whole surface area of the integrated circuit. As another non-limiting example, the size and/or area of the pad(s) may be dependent on the circuit(s) used (e.g., in the integrated circuit module) and the intended function of the circuit(s).

Figure 15:
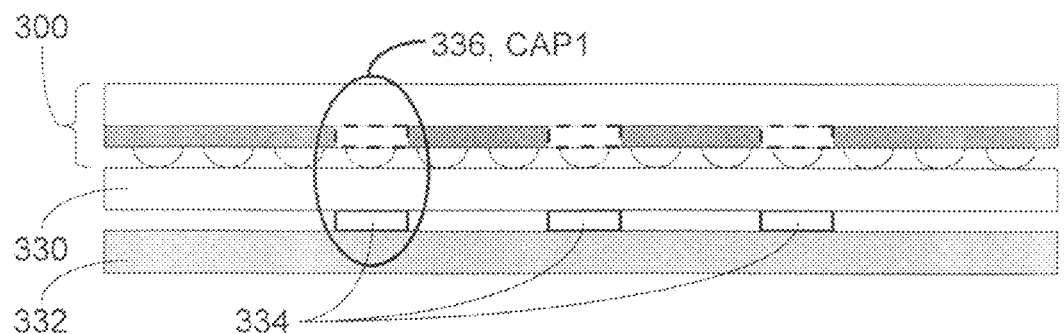
FIG. 15 illustrates a second exemplary embodiment of the invention wherein the integrated circuit module is disposed on a bottom glass of a display module and the three pads are capacitively coupled with three opposing pads that are disposed on a printed wiring board.

FIG. 15 illustrates a second exemplary embodiment of the invention wherein the integrated circuit module 300 is disposed on a bottom glass 330 of a display module and the three pads 311, 312, 313 are capacitively coupled with three opposing pads 334 that are disposed on a printed wiring board 332. The individual capacitive coupling of the three pairs of pads enables the formation of three capacitors. In FIG. 15, the first capacitor (CAP1) 336 is identified. The three capacitors may be utilized for the transmission of signals (e.g., data signals, clock signals, power reference signals) between the module (e.g., a display module) and other components (e.g., a processor controlling a display of the display module) of the device (e.g., a mobile device).

As is apparent in FIG. 15, an insulating material is situated between the pads of each capacitor. As one non-limiting example, this insulating material may comprise a glassivation material such as Silicon Nitride ($Si_3N_4$), for example. As another non-limiting example, the one or both pads of the capacitor may comprise an Aluminum pad such that a reaction between the Aluminum pad and the air (oxygen) creates a nonconductive layer of Aluminum-dioxide ($AlO_2$) on the surface of the Aluminum pad. As another non-limiting example, since the two pads do not touch one another, in some exemplary embodiments air may be considered as the insulating material.

Figure 16:
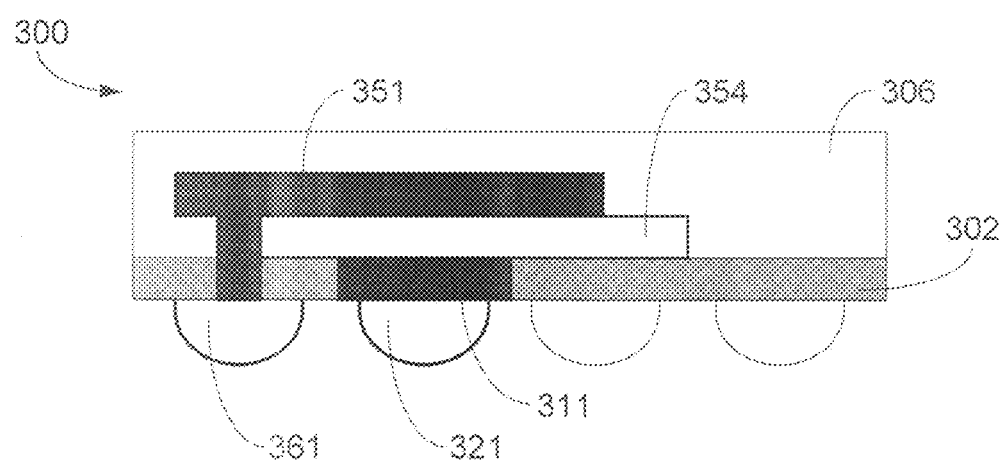
FIG. 16 depicts a third exemplary embodiment of the invention wherein one plate of the capacitor comprises a portion of the protective layer and the other plate is disposed within the interior region of the integrated circuit module.

FIG. 16 depicts a third exemplary embodiment of the invention wherein one plate 311 of the capacitor comprises a portion of the protective layer 302 (e.g., as in FIGS. 13 and 14) and the other plate 351 is disposed within the interior region 306 of the integrated circuit module 300. The other plate 351 may be electrically coupled to a bump 361. There is an insulating material 354 disposed between the two plates 311, 351. In some exemplary embodiments, the insulating material 354 may comprise an insulating layer that substantially covers the area of the protective layer 302 and/or the area of the integrated circuit module 300. As a non-limiting example, the insulating material 354 may comprise a glassivation material (e.g., $Si_3N_4$) or a nonconductive material.

Figure 17:
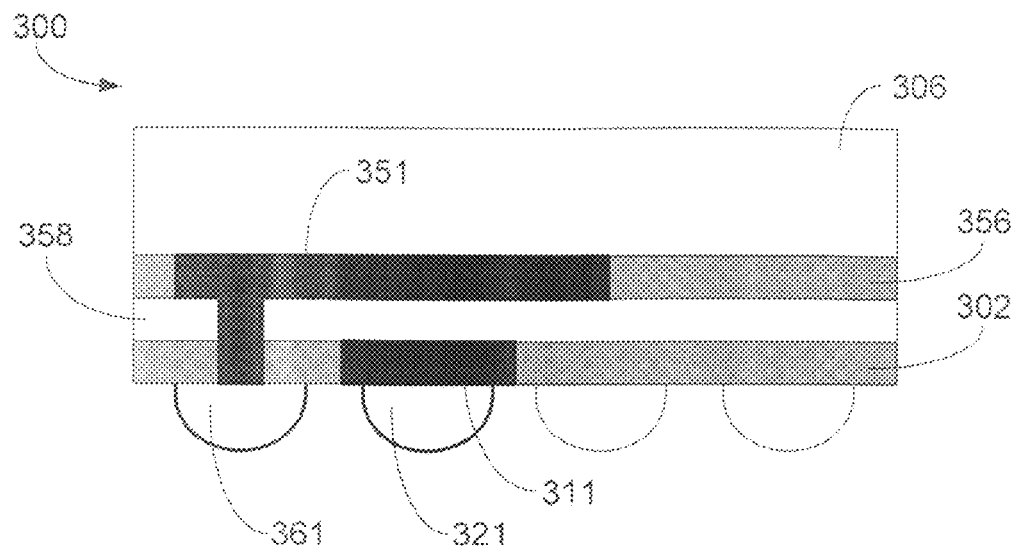
FIG. 17 illustrates a fourth exemplary embodiment of the invention wherein one plate of the capacitor comprises a portion of the first protective layer and the other plate is disposed within a second protective layer that is applied to the integrated circuit module.

FIG. 17 illustrates a fourth exemplary embodiment of the invention wherein one plate 311 of the capacitor comprises a portion of the first protective layer 302 (e.g., as in FIGS. 13 and 14) and the other plate 351 is disposed within a second protective layer 356 that is applied to the integrated circuit module 300 (e.g., on the protected surface). Both of the protective layers 302, 356 are external to the integrated circuit module 300. That is, neither of the protective layers 302, 356 is disposed within the integrated circuit module 300. Both protective layers 302, 356 are applied to the integrated circuit module 300 subsequent to formation of the interior region 306. The other plate 351 may be electrically coupled to a bump 361. There is an insulating layer 358 disposed between the two plates 311, 351. In some exemplary embodiments, the insulating layer 358 substantially covers the area of one or both of the protective layers 302, 356 and/or the area of the integrated circuit module 300.

Since the pads 311, 312, 313 are electrically isolated from each other and from the remainder of the protective layer 302, in some exemplary embodiments of the invention this electrical isolation may lead to gaps in the protective layer 302. Referring to FIG. 13, it can be observed that a thin outline of protective material (i.e., the protective layer 302) is not present around each of the pads 311, 312, 313. In some cases, these gaps may pose a problem for leakage of incident light into the interior region 6 of the integrated circuit module 300.

Figure 18:
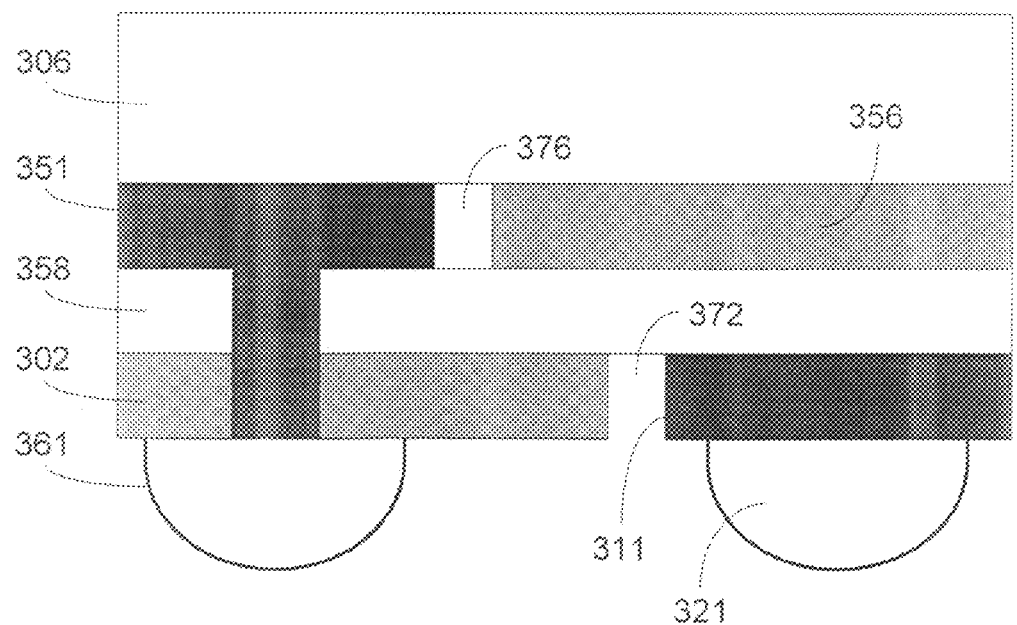
FIG. 18 shows a fifth exemplary embodiment of the invention wherein the two protective layers of FIG. 17 are in a staggered arrangement.
Figure 19:
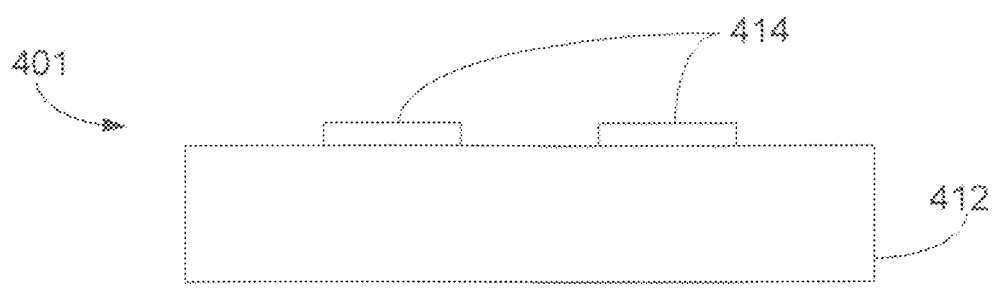
FIGS. 19-22 illustrate an exemplary method for processing a protection layer on an integrated circuit.
Figure 20:
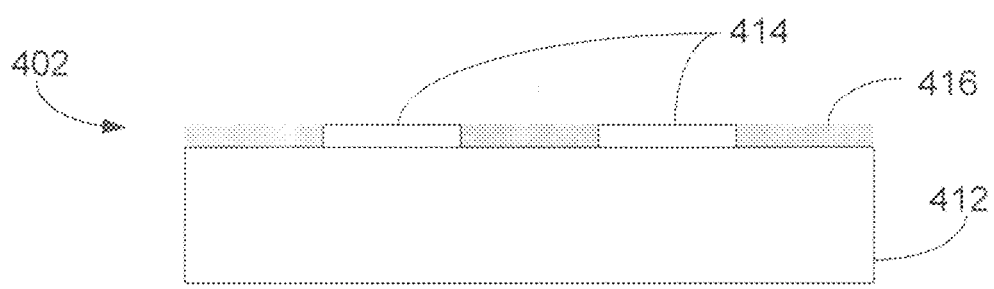
Figure 21:
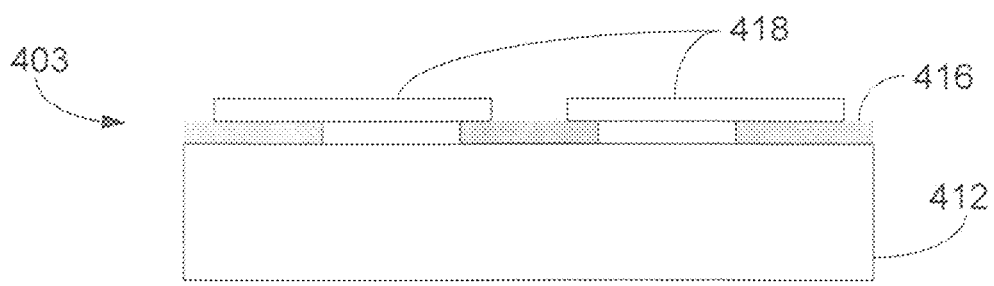
Figure 22:
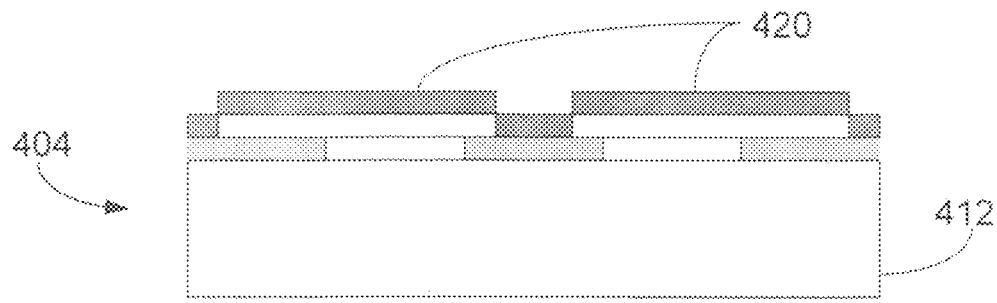

FIG. 18 shows a fifth exemplary embodiment of the invention wherein the two protective layers 302, 356 of FIG. 17 are in a staggered arrangement. That is, the location of the pads 311, 351 within the protective layers 302, 356 of the integrated circuit module are arranged such that the gaps 372, 376 in the protective layers 302, 356 do not substantially overlap. Such an arrangement provides improved protection for the interior region 306 of the integrated circuit module 300.

FIGS. 19-22 illustrate an exemplary method for processing a protection layer on an integrated circuit 412, such as a display driver integrated circuit, as a non-limiting example. In step 401 (FIG. 19), an integrated circuit 412 has been processed to the point where several semiconductor layers have been constructed and the top surface is covered with phosphor-silica glass. The top surface is subjected to reactive ion etching in specific patterns to expose contact areas for metallization. Aluminum is sputtered on the wafer, after which the Aluminum is subjected to reactive ion etching, also in specific patterns, to form connections between the various components of the circuit. This leads to the formation of first Aluminum pads 414.

In step 402 (FIG. 20), a first insulation layer 416 is processed on the surface of the integrated circuit 412. The first Aluminum pads 414 are left open with no insulation covering them.

In step 403 (FIG. 21), a protection layer, which includes second Aluminum pads 418 in accordance with exemplary embodiments of the invention, is processed on the surface of the integrated circuit 412. The first Aluminum pads 414 and the second Aluminum pads 418 are connected during this metallization.

In step 404 (FIG. 22), a second isolation layer 420 is processed on the surface of the integrated circuit 412. In some exemplary embodiments, the second isolation layer 420 comprises a glassivation layer (e.g., Silicon Nitride) that covers the surface of the integrated circuit 412. In other exemplary embodiments, the second isolation layer 420 comprises a nonconductive layer of Aluminum-dioxide ($AlO_2$) that is formed on the surface of the second Aluminum pads 418 due to a reaction between the Aluminum pad and the air (oxygen).

The steps 401-404 illustrated in FIGS. 19-22 and described above are merely exemplary. One of ordinary skill in the art will appreciate the various techniques that are available for the creation of integrated circuits, such as the integrated circuit 412 shown in FIGS. 19-22, in accordance with the exemplary embodiments of the invention.

It should be appreciated that exemplary embodiments of the invention enable at least one portion of the protective layer to act in a dual function, both as protection against incident light and in a capacitive capacity for forming at least one capacitor and/or providing at least one capacitive coupling.

Although shown in FIGS. 13-18 with connectors (e.g., bumps), other exemplary embodiments of the invention may not comprise connectors and/or may comprise a different number and/or arrangement of connectors. As a non-limiting example, the connector(s) may be disposed on a different surface (side, face) of the integrated circuit module. One of ordinary skill in the art will appreciate the different arrangements that may be utilized. Furthermore, one of ordinary skill in the art will appreciate the various compositions available for the connectors, as well as techniques and methods for forming the connectors and/or coupling (e.g., attaching, affixing, embedding) the connectors to the integrated circuit module. Similarly, the integrated circuit module may comprise a different shape, size, dimensions and/or volume than that shown in FIGS. 13-18 and discussed above. In addition, the exemplary embodiments of the invention may utilize any suitable number, size (area, volume), geometry, shape or arrangement of capacitor pads or capacitor plates. Furthermore, in some exemplary embodiments the capacitor pad(s) or plate(s) of the integrated circuit module may be coupled to more than one connector (bump).

The above-noted aspects (characteristics, qualities) of the exemplary embodiments of the invention may depend on one or more considerations, including: one or more design parameters of the integrated circuit module, one or more fabrication parameters of the integrated circuit module, the purpose (intended use) of the integrated circuit module, the function (purpose, intended use) of the capacitor(s), the location of the capacitors (e.g., relative to the integrated circuit module or to an apparatus comprising the integrated circuit module, such as a display module, for example) and/or one or more other factors. A plate of a capacitor ("a capacitor plate") is a region, portion or piece of material that is configured (e.g., arranged, adapted) to act as a plate or pad of a capacitor.

Below are provided further descriptions of various non-limiting, exemplary embodiments. The below-described exemplary embodiments are separately numbered for clarity and identification. This numbering should not be construed as wholly separating the below descriptions since various aspects of one or more exemplary embodiments may be practiced in conjunction with one or more other aspects or exemplary embodiments. That is, the exemplary embodiments of the invention, such as those described immediately below, may be implemented, practiced or utilized in any combination (e.g., any combination that is suitable, practicable and/or feasible) and are not limited only to those combinations described herein and/or included in the appended claims.

(1) In one exemplary embodiment, an apparatus comprising: at least one functional circuit; and an electrically-conductive protective layer on a protected surface of the apparatus, where the protective layer is arranged to be substantially opaque to incident light, where at least one portion of the protective layer is electrically isolated from a remainder of the protective layer, where the at least one portion comprises a plate of a capacitor for coupling at least one signal to said at least one functional circuit.

An apparatus as above, where the at least one signal comprises at least one of a data signal and a clock signal. An apparatus as in any above, where the protective layer comprises a metal-containing layer. An apparatus as in any above, where the metal-containing layer comprises Aluminum. An apparatus as in any above, where the at least one functional circuit comprises a display driver circuit. An apparatus as in any above, where the at least one portion is one of a plurality of portions that are electrically isolated from each other and from the remainder of the protective layer.

An apparatus as in any above, further comprising at least one connector for coupling at least power to the at least one functional circuit. An apparatus as in any above, where the at least one connector is on the protective side and protrudes beyond the protective layer. An apparatus as in any above, where the protective layer is arranged to be substantially opaque to light emitted from a light source illuminating a display. An apparatus as in any above, where a wavelength at which the protective layer is substantially opaque is selected based on a wavelength of the light emanating from the light source.

An apparatus as in any above, further comprising a second electrically-conductive protective layer on the protected surface of the apparatus, where the second protective layer is arranged to be substantially opaque to the incident light, where at least one second portion of the second protective layer is electrically isolated from a remainder of the protective layer, where the at least one second portion comprises a second plate of the capacitor, where the second protective layer and the first protective layer are electrically isolated from each other by an insulating material. An apparatus as in any above, where at least one gap in the first protective layer and at least one gap in the second protective layer are in a staggered arrangement. An apparatus as in any above, where the protected surface of the apparatus is between the first protective layer and a second plate of the capacitor. An apparatus as in any above, where the apparatus comprises an integrated circuit module. An apparatus as in any above, where the apparatus is embodied within a display module. An apparatus as in any above, where the apparatus is embodied within a mobile device. An apparatus as in any above, where the apparatus is embodied within a mobile phone.

Figure 23:
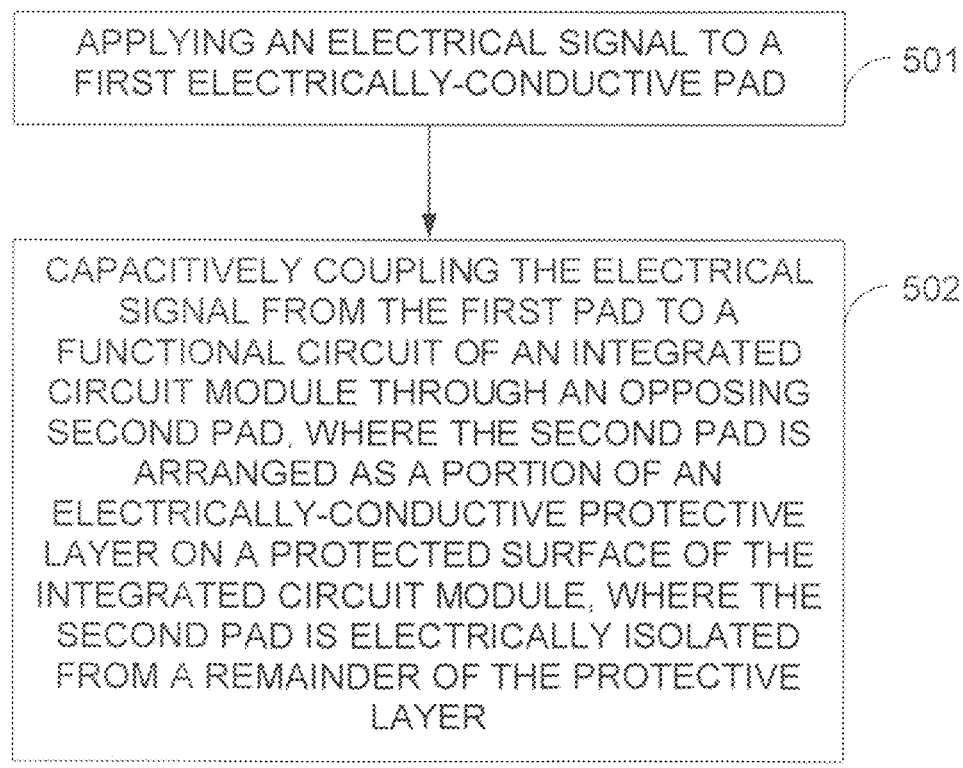
FIG. 23 depicts a flowchart illustrating one non-limiting example of a method for practicing the exemplary embodiments of this invention.

(2) In another exemplary embodiment, and as illustrated in FIG. 23, a method comprising: applying an electrical signal to a first electrically-conductive pad (501); and capacitively coupling the electrical signal from the first pad to a functional circuit of an integrated circuit module through an opposing second pad, where the second pad is arranged as a portion of an electrically-conductive protective layer on a protected surface of the integrated circuit module, where the second pad is electrically isolated from a remainder of the protective layer (502).

A method as above, where the electrical signal comprises at least one of a data signal and a clock signal. A method as in any above, where the functional circuit comprises a display driver circuit. A method as in any above, further comprising electrically coupling power to the functional circuit. A method as in any above, further comprising one or more aspects of the exemplary embodiments of the invention as described in further detail herein.

(3) In another exemplary embodiment, an apparatus comprising: means for applying an electrical signal to a first electrically-conductive pad; and means for capacitively coupling the electrical signal from the first pad to a functional circuit of an integrated circuit module through an opposing second pad, where the second pad is arranged as a portion of an electrically-conductive protective layer on a protected surface of the integrated circuit module, where the second pad is electrically isolated from a remainder of the protective layer.

An apparatus as above, further comprising one or more aspects of the exemplary embodiments of the invention as described in further detail herein.

(4) In another exemplary embodiment, an apparatus comprising: means for performing at least one function; and means for protecting a protected surface of the apparatus, where the means for protecting is electrically-conductive and is arranged to be substantially opaque to incident light, where at least one portion of the means for protecting is electrically isolated from a remainder of the means for protecting, where the at least one portion comprises a plate of a capacitor for coupling at least one signal to said means for performing.

An apparatus as above, where the means for performing comprises at least one functional circuit and the means for protecting comprises a protective layer. An apparatus as in any above, further comprising one or more aspects of the exemplary embodiments of the invention as described in further detail herein.

The exemplary embodiments of the invention, as discussed above and as particularly described with respect to exemplary methods, may be implemented as a computer program product comprising program instructions embodied on a tangible computer-readable medium. Execution of the program instructions results in operations comprising steps of utilizing the exemplary embodiments or steps of the method.

The exemplary embodiments of the invention, as discussed above and as particularly described with respect to exemplary methods, may be implemented in conjunction with a program storage device (e.g., a computer-readable medium, a memory) readable by a machine (e.g., a computer, a mobile station, a mobile device, a mobile node), tangibly embodying a program of instructions (e.g., a program, a computer program) executable by the machine for performing operations. The operations comprise steps of utilizing the exemplary embodiments or steps of the method.

The blocks depicted in FIG. 23 may also be considered to correspond to one or more functions and/or operations that are performed by one or more components, apparatus, processors, computer programs, circuits, integrated circuits, application-specific integrated circuits (ASICs), chips and/or function blocks. Any and/or all of the above may be implemented in any practicable arrangement or solution that enables operation in accordance with the exemplary embodiments of the invention.

Furthermore, the arrangement of the blocks shown in FIG. 23 should be considered merely exemplary and non-limiting. It should be appreciated that the blocks depicted in FIG. 23 may correspond to one or more functions and/or operations that may be performed in any order (e.g., any practicable, suitable and/or feasible order) and/or concurrently (e.g., as practicable, suitable and/or feasible) so as to implement one or more of the exemplary embodiments of the invention. In addition, one or more additional steps, functions and/or operations may be utilized in conjunction with those illustrated in FIG. 23 so as to implement one or more further exemplary embodiments of the invention, such as those described in further detail herein.

That is, the non-limiting, exemplary embodiments of the invention shown in FIG. 23 may be implemented, practiced or utilized in conjunction with one or more further aspects in any combination (e.g., any combination that is practicable, suitable and/or feasible) and are not limited only to the blocks, steps, functions and/or operations illustrated in FIG. 23.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof.

As employed herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical region (both visible and invisible), as several non-limiting and non-exhaustive examples.

While the exemplary embodiments have been described above primarily in the context of a mobile device, it should be appreciated that the exemplary embodiments of this invention are not limited for use with only this one particular type of apparatus, and that they may be used to advantage in other apparatus, systems, modules, units and devices. Similarly, while described above primarily in the context of an integrated circuit suitable for use as part of or in conjunction with a display module, it should be appreciated that the exemplary embodiments of this invention are not limited for use with only such display modules, and that they may be used to advantage in or in conjunction with different types of modules and systems, such as any suitable module or system wherein it may be desirable to capacitively couple two or more components (e.g., using one or more capacitive couplings, as described herein). Such a capacitive coupling may enable the efficient transfer of information, as a non-limiting example.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controllers, other computing devices and/or some combination thereof.

The exemplary embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of the non-limiting and exemplary embodiments of this invention.

Furthermore, some of the features of the preferred embodiments of this invention could be used to advantage without the corresponding use of other features. As such, the foregoing description should be considered as merely illustrative of the principles, teachings and exemplary embodiments of this invention, and not in limitation thereof.

What is claimed is:

1. An apparatus comprising:
   at least one functional circuit; and
   an electrically-conductive protective layer on a protected surface of the apparatus, where the protective layer is arranged to be substantially opaque to incident light, where at least one portion of the protective layer comprises a plate of a capacitor for coupling at least one signal to said at least one functional circuit; and
   a second electrically-conductive protective layer on the protected surface of the apparatus, where the second protective layer is arranged to be substantially opaque to the incident light, where at least one second portion of the second protective layer is electrically isolated from a remainder of the protective layer, where the at least one second portion comprises a second plate of the capacitor, where the second protective layer and the first protective layer are electrically isolated from each other by an insulating material, where at least one gap in the first protective layer and at least one gap in the second protective layer are in a staggered arrangement and do not overlap such that together the first and second protective layers create a seamless protective layer against incident light.

2. An apparatus as in claim 1, where the at least one signal comprises at least one of a data signal and a clock signal.

3. An apparatus as in claim 1, where the protective layer comprises a metal-containing layer.

4. An apparatus as in claim 3, where the metal-containing layer comprises Aluminum.

5. An apparatus as in claim 1,. where the at least one functional circuit comprises a display driver circuit.

6. An apparatus as in claim 1, where the at least one portion is one of a plurality of portions that are electrically isolated from each other and from the remainder of the protective layer.

7. An apparatus as in claim 1, further comprising at least one connector for coupling at least power to the at least one functional circuit.

8. An apparatus as in claim 7, where the at least one connector is on the protective side and protrudes beyond the protective layer.

9. An apparatus as in claim 1, where the protective layer is arranged to be substantially opaque to light emitted from a light source illuminating a display.

10. An apparatus as in claim 9, where a wavelength at which the protective layer is substantially opaque is selected based on a wavelength of the light emanating from the light source.

11. An apparatus as in claim 1, where the protected surface of the apparatus is between the first protective layer and a second plate of the capacitor.

12. An apparatus as in claim 1, where the apparatus comprises an integrated circuit module.

13. An apparatus as in claim 1, where the at least one portion of the protective layer comprises an entirety of the protective layer.

14. An apparatus as in claim 1, where the at least one portion of the protective layer is electrically isolated from a remainder of the protective layer.

* * * * *